(12) United States Patent
Richter et al.

(10) Patent No.: US 9,843,320 B2
(45) Date of Patent: Dec. 12, 2017

(54) CIRCUIT ARRANGEMENT

(71) Applicant: Robert Bosch GmbH, Stuttgart (DE)

(72) Inventors: Tobias Richter, Bietigheim-Bissingen (DE); Stefan Butzmann, Schalksmühle (DE); Stefan Aldinger, Bad Wimpfen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/101,486

(22) PCT Filed: Nov. 14, 2014

(86) PCT No.: PCT/EP2014/074563
§ 371 (c)(1),
(2) Date: Jun. 3, 2016

(87) PCT Pub. No.: WO2015/082190
PCT Pub. Date: Jun. 11, 2015

(65) Prior Publication Data
US 2016/0308526 A1    Oct. 20, 2016

(30) Foreign Application Priority Data
Dec. 4, 2013  (DE) .................. 10 2013 224 891

(51) Int. Cl.
*H02P 6/14*      (2016.01)
*H03K 17/567*    (2006.01)
(Continued)

(52) U.S. Cl.
CPC ............ *H03K 17/567* (2013.01); *H02M 1/08* (2013.01); *H02P 6/14* (2013.01); *H03K 17/162* (2013.01);
(Continued)

(58) Field of Classification Search
CPC .. H02M 1/08; H02M 2001/008; H02M 7/162; H02P 27/06
See application file for complete search history.

(56) References Cited

U.S. PATENT DOCUMENTS

| | | | |
|---|---|---|---|
| 9,326,336 B2* | 4/2016 | Knoedgen | H05B 33/0815 |
| 2007/0063661 A1 | 3/2007 | Galli et al. | |
| 2011/0298436 A1 | 12/2011 | Tant et al. | |

FOREIGN PATENT DOCUMENTS

DE    102010039667    3/2012

OTHER PUBLICATIONS

International Search Report for Application No. PCT/EP2014/074563 dated Feb. 20, 2015 (English Translation, 2 pages).

* cited by examiner

*Primary Examiner* — Karen Masih
(74) *Attorney, Agent, or Firm* — Michael Best & Friedrich LLP

(57) ABSTRACT

The invention relates to a circuit arrangement (1), in particular for controlling an electric machine, comprising at least one high-voltage semiconductor bridge circuit (2) that includes a low-side semiconductor switch (4) and a high-side semiconductor switch (3). A high-side gate driver (5) is assigned to the high-side semiconductor switch (3), and a low-side gate driver (6) is assigned to the low-side semiconductor switch (4). According to the invention, a high-side flyback converter (8) is connected upstream of the high-side gate driver, and a low-side flyback converter (9) is connected upstream of the low-side gate driver (6), at least one of the flyback converters (7, 8, 9) being designed as a high-voltage flyback converter.

8 Claims, 1 Drawing Sheet

(51) Int. Cl.
*H03K 17/16* (2006.01)
*H02M 1/08* (2006.01)
*H02M 3/335* (2006.01)
*H02M 1/00* (2006.01)
*H02M 7/5387* (2007.01)
*H02M 1/32* (2007.01)

(52) U.S. Cl.
CPC .......... *H02M 3/335* (2013.01); *H02M 7/5387* (2013.01); *H02M 2001/0006* (2013.01); *H02M 2001/325* (2013.01); *H03K 2217/0063* (2013.01); *H03K 2217/0072* (2013.01)

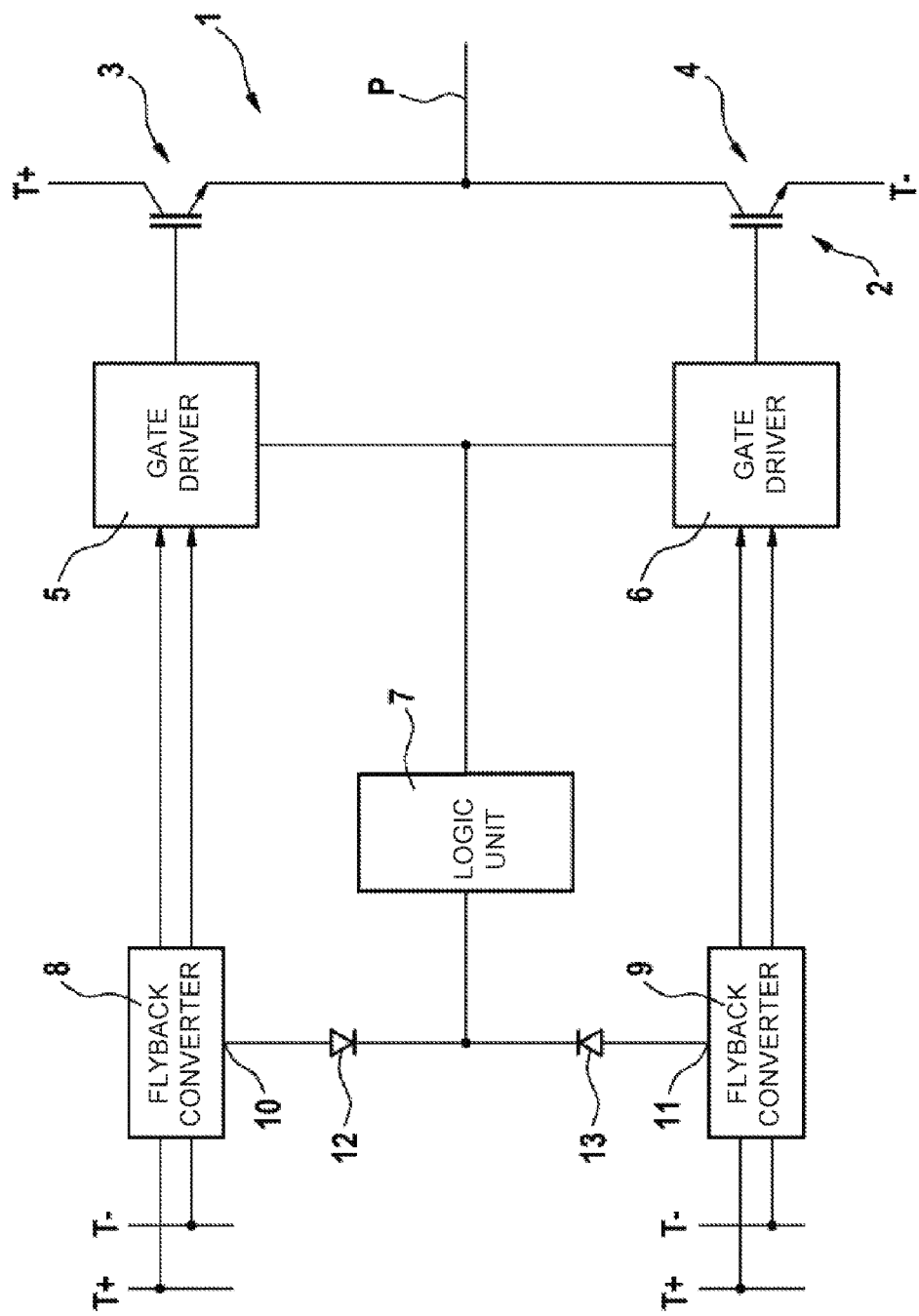

CIRCUIT ARRANGEMENT

BACKGROUND OF THE INVENTION

The invention relates to a circuit arrangement, in particular for driving an electrical machine, comprising at least one high-voltage semiconductor bridge circuit having a low-side semiconductor switch and a high-side semiconductor switch, wherein a low-side gate driver is assigned to the low-side semiconductor switch and a high-side gate driver is assigned to the high-side semiconductor switch.

Circuit arrangements of the type mentioned in the introduction are known from the prior art. Semiconductor bridge circuits are often used in inverters in order to switch the phases of an electrical machine during operation. Gate drivers suitable for fast and optimum switching of the phases are generally provided for switching the individual semiconductor switches. In modern vehicles that also have one or more electrical machines as drive machines, it is known to provide voltage systems having different voltage levels. An on-board electrical system having a low voltage level is usually provided, which is used for example for the operation of a radio, interior luminaires or the like. By contrast, a subsystem having a higher voltage level, the so-called high-voltage system, is used for operating an electrical drive machine having a very much higher energy demand than components of the on-board electrical system. Usually, therefore, the semiconductor bridge circuits of an inverter for an electrical drive machine are also assigned to the high-voltage system since they have to switch the high voltages. However, the driving of the gate drivers themselves is usually carried out by the low-voltage on-board electrical system of the vehicle using forward or flyback converters that have to overcome a required isolation barrier between low-voltage and high-voltage systems. The flyback converters, also called boost or buck converters, form a galvanic isolation between the two systems, such that in particular a voltage overloading of the low-voltage system is avoided.

SUMMARY OF THE INVENTION

The circuit arrangement according to the invention has the advantage that the flyback converters do not have to overcome the isolation barrier and therefore require in particular less structural space with comparable power. The flyback converters of the circuit arrangement according to the invention are preferably designed to ensure a functional isolation instead of a basic isolation. For this purpose, according to the invention it is provided that a high-side flyback converter is connected upstream of the high-side gate driver and a low-side flyback converter is connected upstream of the low-side gate driver, wherein at least one of the flyback converters, that is to say the high-side flyback converter or the low-side flyback converter is designed as a high-voltage flyback converter or is fed by a traction voltage system or high-voltage system. Consequently, the two gate drivers are assigned a respective flyback converter, at least one of which is also designed as a high-voltage flyback converter and in this respect is likewise arranged on the high-voltage side. Just by virtue of the design of one of the flyback converters as a high-voltage flyback converter, the structural space requirement is reduced and at least this flyback converter does not have to overcome the isolation barrier from the low-voltage system to the high-voltage system.

Particularly preferably, it is provided that both flyback converters are designed as high-voltage flyback converters or are assigned to the high-voltage system/traction system. As a result the structural space requirement is further optimized and the advantage with regard to the isolation barrier is maximized. Overall, the circuit arrangement thus proves to be implemented particularly cost-effectively and in a manner saving structural space.

In accordance with one advantageous development of the invention, it is provided that the high-voltage semiconductor bridge circuit has a logic unit, which is connected to at least one of the flyback converters for its voltage supply. The voltage supply of the high-voltage logic unit is thus ensured by the flyback converters of the high-voltage half-bridge circuit. In particular it is provided that the logic unit is designed as or comprises a microcontroller or microprocessor.

Furthermore, it is preferably provided that the logic unit is connected to both flyback converters of the at least one half-bridge circuit. This redundant voltage supply means that a separate emergency supply of the gate drivers which is used only upon failure of the regular supply is no longer necessary.

Preferably, for this purpose, at least one, in particular both flyback converters have an auxiliary winding for the voltage supply of the logic unit. By virtue of the corresponding design of the auxiliary winding, an optimum operating voltage for the logic unit can be provided in a simple manner.

Furthermore, it is preferably provided that the flyback converters are connected to the logic unit in parallel with one another by a respective interposed diode. In the fault situation, that is to say if one of the two flyback converters fails, it is thereby ensured that further operation or a safe state, in particular an active short circuit of a connected electrical machine, can nevertheless be set with the aid of the remaining flyback converter.

Particularly preferably, it is provided that the circuit arrangement is designed as an inverter comprising at least one further half-bridge circuit, in particular two further half-bridge circuits. Preferably, the half-bridge circuits are designed as described above. Alternatively, it may also be provided that the further half-bridge circuits are connected to the two flyback converters of the at least one first half-bridge circuit for their voltage supply.

BRIEF DESCRIPTION OF THE DRAWING

The invention will be explained in greater detail below on the basis of an exemplary embodiment. In this respect, the single FIGURE shows a circuit arrangement in its simplified illustration.

DETAILED DESCRIPTION

FIG. 1 shows a circuit arrangement 1 for operating an electrical machine that is supplied from a traction voltage system or high-voltage system. The circuit arrangement 1 is designed as an inverter comprising three semiconductor bridge circuits, only one semiconductor bridge circuit 2 of which is illustrated here for reasons of clarity.

The semiconductor bridge circuit 2 comprises two series-connected semiconductor switches 3 and 4, of which one semiconductor switch 3 is designed as a high-side semiconductor switch and the other is designed as a low-side semiconductor switch 4. That means that the semiconductor switch 3 switches a positive traction system voltage T+, while the semiconductor switch 4 switches a negative traction voltage T−.

The two semiconductor switches 3, 4 are assigned a respective gate driver 5 and 6, wherein the gate drivers 5, 6 may be correspondingly designated as high-side gate driver 5 and as low-side gate driver 6. The two gate drivers 5, 6 are driven by a logic unit 7, which in particular comprises a microcontroller. In accordance with the stipulations of the logic unit 7, the gate drivers 5, 6 drive the semiconductor switches 4 in order to supply a phase P, for example U, V or W, of the electrical machine with voltage. Correspondingly, the further half-bridge circuits, not illustrated, are also driven by the logic unit 7. In this case, each semiconductor bridge circuit is assigned to a phase of the electrical machine.

For operating the gate drivers 5, 6, the latter are also supplied with a supply voltage. For this purpose, in the present case, two flyback converters 8, 9 are provided, which are respectively connected upstream of one of the gate drivers 5, 6. In this respect, the flyback converters 8, 9 are likewise designed as high-side and low-side flyback converters 8 and 9, respectively. The flyback converters 8, 9 preferably in each case comprise a flyback converter transformer for galvanically decoupling the semiconductor bridge circuit 2. The circuit arrangement 1 essentially constitutes a part of a high-voltage system which serves for operating the electrical machine.

The logic unit 7 is preferably driven and optionally monitored by a device on a low-voltage side of the overall system or of the circuit arrangement 1.

Both flyback converters 8, 9 furthermore comprise an auxiliary coil (not illustrated more specifically here) serving for the voltage supply of the logic unit 7. By means of the auxiliary coil, an optimum operating voltage for the logic unit 7 is made available by a further output 10, 11 of the respective flyback converters 8, 9. In this case, said outputs 10, 11 of the flyback converters 8, 9 or of the flyback transformers are connected to the logic unit 7 by a respective diode 12, 13. The flyback converters 8, 9 are thus connected to the logic unit 7 in a manner connected in parallel with one another. If one of the flyback converters 8, 9 fails, then the operation of the gate drivers 5, 6 can substantially be maintained by the remaining flyback converter 9 or 8. A redundant energy supply of the logic unit 7 is ensured hereby.

Expediently, the two separated flyback converters 8, 9, which are ideally constructed identically, are used for the supply of the high-side gate drivers 5 and of the low-side gate drivers 6, in particular of all the semiconductor bridge circuits of the circuit arrangement 1. The supply of the logic unit 7 and of the microcontroller possibly provided is then carried out redundantly via the auxiliary windings of the flyback converter transformers of the flyback converters 8, 9 which are connected in parallel via the diodes 12, 13.

The invention claimed is:

1. A circuit arrangement (1) comprising a high-voltage semiconductor bridge circuit (2) having a low-side semiconductor switch (4), a high-side semiconductor switch (3), and a logic unit (7), wherein a high-side gate driver (5) is assigned to the high-side semiconductor switch (3) and a low-side gate driver (6) is assigned to the low-side semiconductor switch (4), characterized in that a high-side flyback converter (8) is connected upstream of the high-side gate driver and a low-side flyback converter (9) is connected upstream of the low-side gate driver (6), and the logic unit (7) is connected to at least one of the flyback converters (8, 9), wherein at least one of the flyback converters (7, 8, 9) is a high-voltage flyback converter; and wherein a supply voltage for the logic unit (7) comes from at least one of the connected flyback converters (8, 9).

2. The circuit arrangement as claimed in claim 1, characterized in that both flyback converters (8, 9) are high-voltage flyback converters.

3. The circuit arrangement as claimed in claim 1, characterized in that the logic unit (7) is connected to the two flyback converters (8, 9) and a supply voltage for the logic unit (7) comes from both of the connected flyback converters (8, 9).

4. The circuit arrangement as claimed in claim 1, characterized in that at least one of the flyback converters (8, 9) has an auxiliary winding for the voltage supply of the logic unit (7).

5. The circuit arrangement as claimed in claim 1, characterized in that the flyback converters (8, 9) are connected to the logic unit (7) in parallel with one another by a respective interposed diode (12, 13).

6. The circuit arrangement as claimed in claim 1, wherein the circuit arrangement is an inverter comprising at least one further semiconductor bridge circuit.

7. The circuit arrangement as claimed in claim 1, wherein the circuit arrangement drives an electric machine.

8. The circuit arrangement as claimed in claim 1, characterized in that both of the flyback converters (8, 9) have an auxiliary winding for the voltage supply of the logic unit (7).

* * * * *